RE 25952

July 15, 1958 J. I. PANKOVE 2,843,511
SEMI CONDUCTOR DEVICES
Filed April 1, 1954

INVENTOR.
JACQUES I. PANKOVE
BY J. L. Whittaker
ATTORNEY

United States Patent Office 2,843,511
Patented July 15, 1958

2,843,511

SEMI-CONDUCTOR DEVICES

Jacques I. Pankove, Princeton, N. J., assignor to Radio Corporation of America, a corporation of Delaware Application April 1, 1954, Serial No. 420,401

9 Claims. (Cl. 148—1.5)

This invention relates to improved semi-conductor devices and improved methods of making them. More particularly it relates to such devices having improved electrical characteristics and relatively low surface recombination velocities.

A semi-conductor device generally includes a base of a semi-conductive material of one conductivity type either n or p which has an excess of one type of electric current carriers, electrons or holes, with respect to current carriers of the opposite type. The excess carriers are called "majority" carriers and the opposite type carriers are called "minority" carriers. The operation of many semi-conductor devices such as transistors depends upon minority carriers being injected into a semi-conductor body at one rectifying barrier and being collected at another rectifying barrier after traversing the base region between the barriers.

The efficiency of such devices depends upon the proportion of the injected minority carriers that are collected, since uncollected carriers represents a lost fraction of a signal input. The minority and majority carriers being of opposite electrical sign are mutually attractive and when a minority carrier combines with a majority carrier both the carriers are lost. A relatively large proportion of this loss occurs at the surface of the semi-conductor body and is called surface recombination. The loss occurring within the body, bulk recombination, is generally of somewhat less importance than surface recombination and may be minimized by known techniques of preparing the semi-conductive material.

The surface recombination effect in a body is measured by a coefficient called the surface recombination velocity which may be defined as the average velocity with which injected minority carriers approach the surface of the body. This average velocity is determined by diffusion limitations and is increased by the surface recombination which brings about a relatively low minority carrier concentration at the surface and thus induces an increased concentration graident adjacent to and in the direction of the surface. An increase in the concentration gradient increases the diffusion velocity in the direction of the gradient.

One object of the instant invention is to provide an improved method of minimizing surface recombination velocity in a semiconductor device.

Another object is to provide improved semi-conductor devices having reduced surface recombination velocities.

These and other objects are accomplished by the instant invention according to which the base of a semi-conductor device is provided with a surface film separated from the bulk of the body by a rectifying barrier. The barrier extends over all, or at least a major portion of the exposed surface of the wafer and provides an electric field to repel the minority carriers from the surface. The minority carriers are confined within the bulk of the body and do not approach the surface. The surface recombination is thus effectively minimized.

The invention will be described in greater detail in connection with the accompanying drawing of which:

Figure 1:
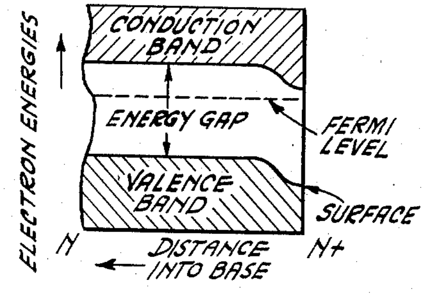
Figures 1–4 are schematic, cross-sectional, energy-level diagrams of small regions adjacent to the surfaces of semi-conductor bodies of devices of the invention.

According to the invention a semi-conductor body of a device is treated to provide a thin surface region, or film on the body separated from the bulk of the body by a rectifying barrier. The surface region has a relatively high conductivity but is shaped to minimize its lateral conductance. It is a part of the body and is not chemically different except for its impurity content. The region is not constituted by an oxide film, for example, but is essentially of the same chemical material as the bulk of the body and has the same crystallographic structure as the bulk.

According to a first embodiment of the invention the film may be continuous in nature. According to a second embodiment the film is discontinuous and consists of discrete "islands" isolated one from another on the surface. The film may be of either the same or the opposite con ductivity type as the bulk of the base body, and is produced by introducing selected impurities into a surface region of the body.

In the energy band theory of solids, several discrete levels of energy are postulated. An electron is raised in energy by moving from a lower band or level to a higher one. The lowest band is designated the valence band or normally filled band. The highest band is called the conduction band or the normally empty band. Between these two bands exists an energy band gap referred to as the forbidden band or energy band gap region. For a metallic conductor such as copper the filled band and conduction bands overlap with substantially no energy band gap existing. For typical semi-conductors, the energy band gap may have a width of a fraction of an electron volt to 1 or 2 electron volts, this gap increasing in width until the materials are considered to behave as insulators. It has been found that in semi-conductive materials such as germanium, silicon, and the like, imperfections or impurities present in the crystal structure result in either an excess of free electrons or a deficiency of such electrons being present. These excess free electrons act as negative charge carriers and are responsible for the conduction of electricity in the crystal. Where a deficiency of electrons exists because of electrons having been effectively ejected from the crystal structure, empty spaces called "holes" are left behind in the crystal structure. These holes can be filled by the movement of electrons into them leaving behind other holes. Under the infleunce of an electric field the hole behaves essentially as an excess electron with a positive electronic charge. Thus it has been found extremely convenient and useful in solid-state theory to regard the conduction of electricity in the semi-conductor crystal as being carried on by negative and positive electric charge carriers, namely electrons and holes. A crystalline semi-conductor having a substantially equal number of electrons and holes is referred to as an intrinsic semi-conductor. A semi-conductor whose conductivity depends upon excess charge carriers is called an extrinsic semi-conductor. Where the electrons are present in excess, the semi-conductor is designated as n-type; for holes in excess, a p-type. The doted line throughout the diagrams represents the Fermi level, $E_f$. This is the level at absolute zero temperature where statistically the available electrons fill all the energy levels below $E_f$ while none of the energy levels above $E_f$ is occupied. As may be noted, the Fermi level for n-type material is closer to the conduction band than to the valence band. For p-type material, the Fermi level is located closer to the valence band.

Figure 2:
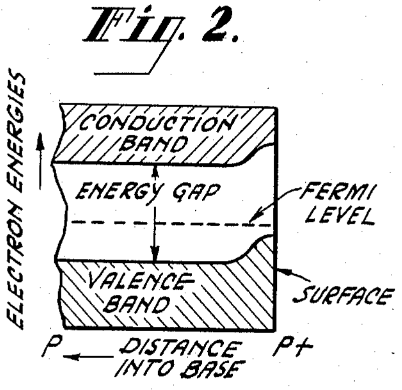

Figures 1 and 2 are schematic, cross-sectional energy-level diagrams representing the energy distributions at the surfaces of semi-conductor bodies having films of the same conductivity types as the bulk of the bodies. Figure 1 represents a body of n-type conductivity having a surface film also of n-type conductivity, but having a higher concentration of donor impurities and, therefore, of majority charge carriers. This higher concentration of majority charge carriers at the surface is represented as N+ in the energy-level diagram. Figure 2 represents a p-type conductivity body having a p-type surface film. This higher conductivity p-type film is represented as P+ in the enregy-level diagram. In these two cases the majority charge carriers, electrons and holes, respectively, exist in greater concentration in the surface regions than in the bulk of the bodies thus creating a potential step, or barrier adjacent to the surface. This barrier repels minority charge carriers away from the surface.

In the case of the n-type material shown in Figure 1, for example, the majority carriers are electrons and the minority carriers are holes. The potential gradient, or step, produced by the increased concentration of donor impurities at the surface repels holes from the surface. Thus the holes are effectively restrained within the bulk of the material and the surface recombination velocity is minimized. In the p-type material of Figure 2 the converse situation exists and electrons, which are the minority charge carriers in p-type material, are repelled from the surface.

Figure 3:
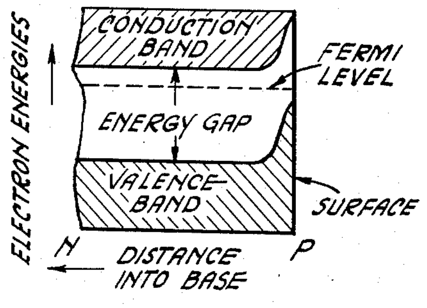
Figure 4:
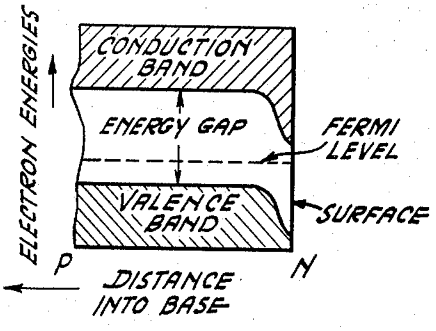

Figures 3 and 4 illustrate the energy level situation in base bodies having surface layers of a conductivity type opposite to the bulk of the bodies. These bodies include p–n rectifying junctions closely adjacent to their surfaces. Although such junctions attract minority carriers to the surfaces they effectively decrease the surface recombination velocity of these carriers because once at the surface the carriers become majority carriers and do not find minority carriers with which to combine. At the surfaces minority carriers exist in insufficient numbers to cause an effective reduction in the numbers of the majority carriers. In the n-type body illustrated by Figure 3, for example, the majority carriers are electrons and the minority carriers are holes. When holes diffuse through the bulk of the material and approach the surface they are accelerated across the barrier into the surface region where they become majority carriers and do not find available electrons with which to combine. A relatively high concentration of holes is thus produced at the surface, which concentration causes a space charge effect in the direction which repels further holes from leaving the bulk toward the surface. The converse situation exists in the p-type body of Figure 4 wherein electrons are the minority carriers in the bulk of the body but are the majority carriers at the surface.

Figure 5:
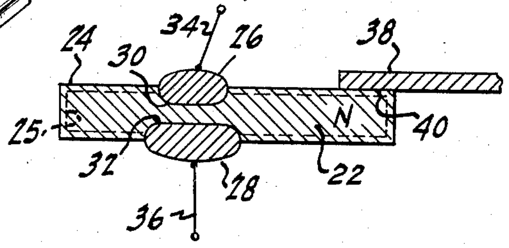
Figure 5 is a schematic, cross-sectional, elevational view of a typical device according to the invention.

One embodiment of the instant invention is represented in the alloy junction transistor device shown in Figure 5. This device comprises an n-type semi-conductive germanium base wafer 22 having a surface region, or film 24 of p-type conductivity electrically separated from the bulk of the wafer by a barrier 25. An emitter electrode 26 and a collector electrode 28 are alloyed into opposite surfaces of the wafer to form two closely adjacent p–n rectifying barriers 30 and 32 respectively. Electrical leads 34 and 36 are attached to the electrodes and a base tab 38 is attached by means of a non-rectifying solder connection 40 to the wafer.

The device may be initially prepared according to any known method. For example, a wafer of n-type semi-conductive germanium of a desired size such as about 0.125" x 0.125" x .010" thick is etched in a solution of hydrofluoric and nitric acids to reduce its thickness to about .006" and to expose a fresh, crystallographically undisturbed surface. Electrode pellets of indium are placed in alignment upon opposite surfaces of the wafer and the ensemble is heated at about 500° C. for about five minutes to alloy the pellets to the wafer and to form the rectifying barriers within the wafer. A base tab 38 which may be of nickel is attached by means of a non-rectifying solder connection to the wafer. The device is etched in a solution comprising hydrofluoric acid, nitric acid and bromine. This etching removes contaminants that may be deposited upon the surface of the wafer during the heating. Such contaminants may provide electrical leakage paths in the device and adversely affect its operation.

The surface recombination velocity of the wafer is reduced according to the present embodiment of the invention by diffusing a relatively small quantity of a p-type impurity material into the surface of the wafer. This may be accomplished by evaporating in vacuo a thin film of a selected p-type conductivity-imparting impurity material such as indium, zinc or aluminum upon all the exposed surfaces of the device. The film is preferably about 10 Angstroms thick, although this thickness is not critical. Sufficient material is deposited to form a film completely to cover the device. If the film is too thick, however, the p-type region subsequently formed at the surface of the wafer will be relatively thick and may adversely affect the electrical characteristics of the device. The p-type surface layer formed in the device has relatively high conductivity and, if it is of substantial thickness, it may provide an electrical leakage path or short-circuit between the two electrodes of the device. By making the surface region relatively thin, such as about 100 Angstroms or less, the lateral conductance of the film is minimized so that it does not adversely affect the electrical operation of the device.

The device bearing the film of p-type impurity material is heated at about 500° C. for about one to two minutes to diffuse the material of the film into the surface of the wafer and to form a surface region in the wafer having a relatively high conductivity and being of the opposite conductivity type from the bulk of the wafer. As explained heretofore, and as shown schematically in Figure 3, such a surface film serves to minimize the surface recombination velocity in the base wafer of the device and thus improves the operational characteristics of the device.

Other devices corresponding to the energy-level diagrams of Figures 1, 2 and 4 may be made in a similar manner to the transistor device heretofore described except that different materials are utilized to provide the different type conductivities shown. For example, to produce a device corresponding to the energy-level diagram of Figure 1, the base wafer may be of n-type germanium or silicon, the electrodes may be formed of an alloy of lead and antimony, and an n-type surface region may be formed by evaporating and diffusing arsenic, antimony or bismuth into the surface.

The practice of the invention is not limited to the particular materials described herein but is generally applicable to all semi-conductor devices having a base of a crystalline, semi-conductive material and means for injecting minority charge carriers into the bulk of the base. Other semi-conductors than germanium and silicon may be utilized such as, for example, aluminum antimonide or indium phosphide. It is only necessary to provide a thin surface region forming a barrier and having a relatively high conductivity with respect to the bulk of the base and a relatively low lateral conductance. The surface region may be of either conductivity type, that is, it may be of the same conductivity type as the major portion of the base or of the opposite conductivity type. In either event the surface region serves to reduce the surface recombination velocity of the base and to improve the electrical performance of the device. The conductivity type of the surface region may be selected to provide any of a number of different properties that may be desired in the device being treated. For example, the conductivity type arrangements illustrated in Figures 3 and 4 are presently preferred in making photo devices since rectifying barriers of the type shown in these figures are relatively sensitive to light and the surface regions, therefore, tend to increase the photosensitivity of such devices.

Alternatively, instead of evaporating the selected impurity material on the surface of the device, the material may be deposited upon the surface in sufficient quantities by immersing the device in a liquid that contains dispersed ions of the selected material. For example, if a device such as the transistor heretofore described, after being etched, is immersed in a dilute solution of copper nitrate, copper ions will adhere to the surface of the device. When the device is subsequently heated at temperatures below about 700° C. the ions will diffuse into the wafer to form a p-type conductivity surface region. Conversely, arsenic ions may be deposited on and diffused into such a device to provide an n-type surface region.

When, in making the transistor device heretofore described, the impurity pellets are alloyed to the wafer, a portion of the impurity pellets evaporates and is deposited on the surface of the wafer to form a p-type region at the surface. Ordinarily, however, the region thus formed is relatively thick and is coated with a metallic layer. Such a thick region and, particularly, the metallic coating are detrimental in the operation of the device and are removed by the etching step described. Satisfactory results according to the invention may be achieved by etching away the coating and only partially etching away the surface region. This technique, however, is relatively difficult and the etching step is critical. Furthermore, the amount of etching required varies depending principally upon the time and temperature of heating in the alloy step and must be empirically determined for each particularly processing arrangement.

According to a second embodiment of the invention the surface recombination velocity of a semi-conductor body is minimized by means of a surface region having any one of the energy-level characteristics shown in Figures 1–4 but being discontinuous in form, as a mosaic. Such a surface region need not be as thin as the continuous surface regions heretofore described since it consists of discrete regions separated one from another and its lateral conductance is limited by its discontinuous nature rather than by its thickness.

Figure 6:
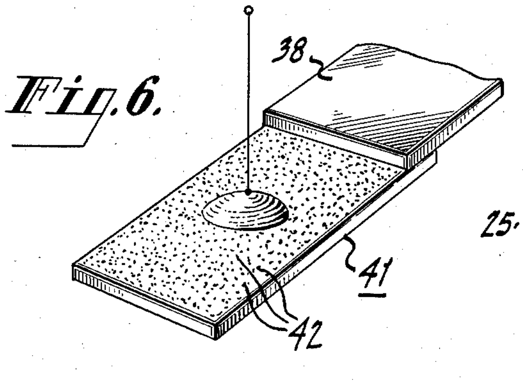
Figure 6 is a perspective view of another different device according to a second embodiment of the invention.

A discontinuous surface film may be provided by evaporating a relatively thick film of a selected impurity material on the surface of the semi-conductor body and heating the body and film at a relatively low temperature for a relatively long time. The film under such heating breaks up and the material of the film coagulates into isolated regions, or islands on the surface of the body. As a particular example, and referring to Figure 6, a transistor device 41, similar to the device heretofore described, may be treated by evaporating upon it a film of indium about 500 Angstroms thick. The device is then heated at about 300° C. for about thirty minutes or more to cause the evaporated material to migrate along the surface and to form itself into isolated, discrete islands 42 on the surface. Because of the relatively low temperature of heating, only minute quantities of the film material diffuse into the semi-conductor wafer and the depth of diffusion is small. There is thus formed a large number of discrete, isolated barrier regions dispersed over the surface of the semi-conductor body. At those portions of the surface which comprise the barrier regions, the surface recombination velocity is minimized. By suitable selection of materials, that is, by selecting an impurity material having a relatively low melting point and a relatively small diffusion coefficient in the semi-conductor, and by evaporating a film of controlled thickness, preferably not more than about 500 Angstroms, the discrete barrier regions formed at the surface may be made not only relatively small but also great in number so that they occupy a relatively high proportion of the exopsed surface.

There have thus been described improved semi-conductor devices having relatively low surface recombination velocities and methods of making such devices.

What is claimed is:

1. A crystalline semi-conductor device including a base of a semi-conductive material, emitter and collector electrodes in contact with said base; said base having a surface region adjacent at least one of said electrodes, said region being of high conductivity and low lateral conductance relative to the bulk of said base, and being of the same conductivity type as the bulk of said base and being separated therefrom by a rectifying barrier.

2. A semi-conductor device including a base of N-type semi-conductive germanium, emitter and collector electrodes in contact with said base; said base having an N-type semi-conductive surface region adjacent at least one of said electrodes, said region being of high conductivity and low lateral conductance relative to the bulk of said base, said region extending over substantially the entire exposed surface of said base.

3. A semi-conductor device including a base of P-type semi-conductive germanium, emitter and collector electrodes in contact with said base; said base having a P-type semi-conductive surface region adjacent at least one of said electrodes, said region being of high conductivity and low lateral conductance relative to the bulk of said base.

4. A semi-conductor device including a base of a crystalline semi-conductive material, emitter and collector electrodes in contact with said base; said base having a surface region adjacent at least one of said electrodes, said region being of high conductivity and low lateral conductance relative to the bulk of said base, and being separated from the bulk of said base by a rectifying barrier, and extending over substantially the entire exposed surface of said base and being less than about 100 Angstroms thick.

5. A semi-conductor device including a base of a crystalline semi-conductive material, emitter and collector electrodes in contact with said base; said base having a multiplicity of discrete surface regions adjacent at least one of said electrodes, said region being of high conductivity relative to the bulk of said base, said regions being separated from the bulk of said base by rectifying barriers and occupying a substantial portion of the exposed surface of said body.

6. A semi-conductor device including a base of a crystalline semi-conductive material, emitter and collector electrodes in contact with said base; said base having a discontinuous surface region adjacent at least one of said electrodes, said region being of high conductivity and low lateral conductance relative to the bulk of said base, said discontinuous surface region being separated from the bulk of said base by a rectifying barrier.

7. A semiconductor device comprising a body of a crystalline semiconductive material having a pair of opposed surfaces, junction electrodes disposed in each of said surfaces to form rectifying junctions in said body, and a region of high conductivity and low lateral conductance covering at least one of said surfaces adjacent the electrode therein.

8. A semiconductor device comprising a body of n-type germanium having a pair of opposed surfaces, an emitter junction electrode disposed in one surface of said body to inject minority charge carriers into the bulk of said body, a collector junction electrode disposed in the opposed surface of said body to collect said charge carriers from the bulk of said body, and an n-type semiconductive surface of high conductivity and low lateral conductance relative to the bulk of said base disposed on at least one of said surfaces adjacent the electrode therein.

9. A semiconductor device according to claim 8 wherein said surface region extends over substantially the entire exposed surface of said body and is less than about 100 angstroms thick.

References Cited in the file of this patent

UNITED STATES PATENTS

| | | |
|---|---|---|
| 2,524,035 | Bardeen et al. | Oct. 3, 1950 |
| 2,560,792 | Gibney | July 17, 1951 |
| 2,561,411 | Pfann | July 29, 1951 |
| 2,589,658 | Bardeen et al. | Mar. 18, 1952 |
| 2,597,028 | Pfann | May 20, 1952 |
| 2,603,694 | Kircher | July 15, 1952 |
| 2,623,102 | Shockley | Dec. 23, 1952 |
| 2,770,761 | Pfann | Nov. 13, 1956 |

UNITED STATES PATENT OFFICE

CERTIFICATE OF CORRECTION

Patent No. 2,843,511 — July 15, 1958

Jacques I. Pankove

It is hereby certified that error appears in the printed specification of the above numbered patent requiring correction and that the said Letters Patent should read as corrected below.

Column 6, line 10, strike out "crystalline" and insert the same before "semi-conductive" in line 11, same column.

Signed and sealed this 23rd day of September 1958.

(SEAL)
Attest:

KARL H. AXLINE
Attesting Officer

ROBERT C. WATSON
Commissioner of Patents